July 16, 1957 B. NIEDERMAN ET AL 2,799,832

ELECTROMECHANICAL FILTER

Filed Sept. 11, 1953 2 Sheets-Sheet 1

INVENTORS.
Bernard Niederman
Stanley P. Lapin
By. Norman L. Mueller Atty.

INVENTORS.
Bernard Niederman
Stanley P. Lapin
By. Norman L. Mueller
Atty.

United States Patent Office 2,799,832

Patented July 16, 1957

2,799,832

ELECTROMECHANICAL FILTER

Bernard Niederman and Stanley P. Lapin, Chicago, Ill., assignors to Motorola, Inc., Chicago, Ill., a corporation of Illinois Application September 11, 1953, Serial No. 379,550

10 Claims. (Cl. 333—71)

This invention relates generally to frequency selective devices and more particularly to an electromechanical filter such as may be used in the selective portions of a radio receiver.

Frequency selecting circuits which have been generally used in radio receivers and other electronic equipment have been of the electrical filter type including resistance, capacitance and inductance elements which are combined to provide a desired frequency response. Although these units have operated satisfactorily, in order to provide high selectivity, the size and number of components required have been such that a large over-all equipment results. It has been proposed to use mechanical wave filters in such radio applications but difficulties have been encountered which have prevented such units from being satisfactory commercially. For example, to provide highly accurate characteristics, the mechanical components must be very accurately constructed and the assembly thereof must be carefully performed. Also the characteristics of certain components required have been found to change with temperature to thereby change the overall characteristics of the filter, and this is very undesirable.

Reference is made to the copending applications of Myron L. Anthony and Robert M. Virkus maturing as Patents Nos. 2,652,542 and 2,652,543 which disclose and claim electro-mechanical filters.

It is therefore an object of the present invention to provide an improved electromechanical wave filter for use in radio or other electronic equipment operating at medium and high frequencies.

A further object of this invention is to provide an electromechanical filter wherein the selectivity characteristics can be controlled in the assembly thereof so that extremely accurate manufacturing tolerances of the components are not required.

A still further object of this invention is the provision of a method for controlling the band pass of an electromechanical filter structure which does not depend upon the characteristic of the individual components used so that the same components can be used to make up filters having different characteristics.

A feature of this invention is the provision of an electromechanical filter including a plurality of vibrating plates interconnected by wires, wherein the position of the wires on the plates is selected to provide the desired band pass characteristics of the filter.

A further feature of this invention is the provision of an electromechanical filter including a plurality of plates coupled in a series to form a multi-section filter, with the end sections which provide electrical coupling to the unit having a wide band pass characteristic and the intermediate sections having a narrow band pass characteristic so that the over-all characteristic of the unit is controlled primarily by the intermediate sections, and is substantially independent of the characteristics of the end sections.

Another feature of this invention is the provision of an electromechanical filter including a plurality of plates connected in a ladder-like structure by fine wires, with the spacing of the wires controlling the band pass of the various sections and being different for various sections to provide different band pass characteristics for the various sections which are combined to provide a desired over-all characteristic. As an example, the spacing of the wires connected to one plate may be close to provide a very narrow band pass and the spacing of the wires connected to the remaining plates may be wide to provide a wider band pass so that when the various sections are combined a band pass characteristic having a rounded nose is provided which tends to prevent undesired transient responses.

A still further feature of the present invention is the provision of an electromechanical filter including a plurality of plates which are interconnected by coupling wires so positioned to provide the required band pass characteristic, with damping means engaging the plates for preventing flexural vibration thereof and/or for damping the plates and coupling wires to modify the frequency response thereof.

Further objects, features and the attending advantages of the invention will be apparent from a consideration of the following description when taken in connection with the accompanying drawings, wherein.

In practicing the invention there is provided a very compact electromechanical device including a filter structure mounted in a hermetically sealed housing. The entire unit may be approximately 2½ inches long by ½ inch by ¾ of an inch. Supported within the housing is a trough on which the filter unit proper rests. The filter unit includes thin rectangular plates interconnected by pairs of thin wires and may be damped so that flexural and other spurious modes of vibration are prevented. The trough extends through shield plates with the extensions thereof supporting coupling coils and biasing magnets which cooperate with magnetostrictive end plates. Alternatively piezo-electric driving members can be used instead of the magnetostrictive driving structure. It has been found that the pass band of any particular filter section will depend upon the spacing of the coupling wires as the vibration characteristics of the plate vary along the height thereof. It is therefore possible to provide filters having various different band pass characteristics by using plates and wires of a given size by merely changing the position of the connection of the wires to the plates. Further, the spacing of the wires may be varied in a single filter structure to provide wide band pass for magnetostrictive end sections so that changes in characteristic thereof due to changes in temperature have little effect on the over-all characteristic of the filter.

Also, the band pass characteristics of various sections may differ from each other so that the over-all characteristic of the filter may have a desired configuration.

Filters so constructed having end plates and five intermediate plates and operating at 455 kilocycles have an insertion loss of from 8 to 15 decibels. A filter having a band width of 10 kilocycles at the 6 decibel point may have a band width of only 16 kilocycles at the 60 decibel point for a rejection slope as high as 18 decibels per kilocycle. In this filter all spurious responses are rejected by about 68 decibels, with the strongest spurious responses being widely separated from the pass band so that they may be of no consequence in many applications, and may be easily rejected by other selectivity as in a radio receiver.

Figure 1:
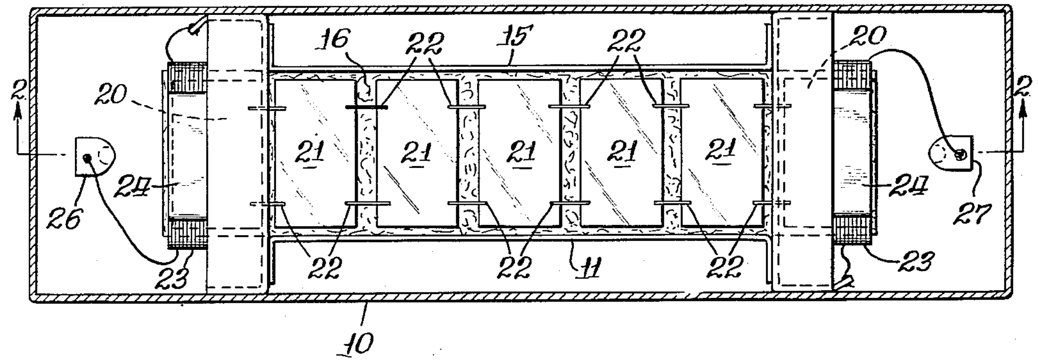
Fig. 1 is a cross sectional plan view of a filter structure showing the interconnected plates.
Figure 2:
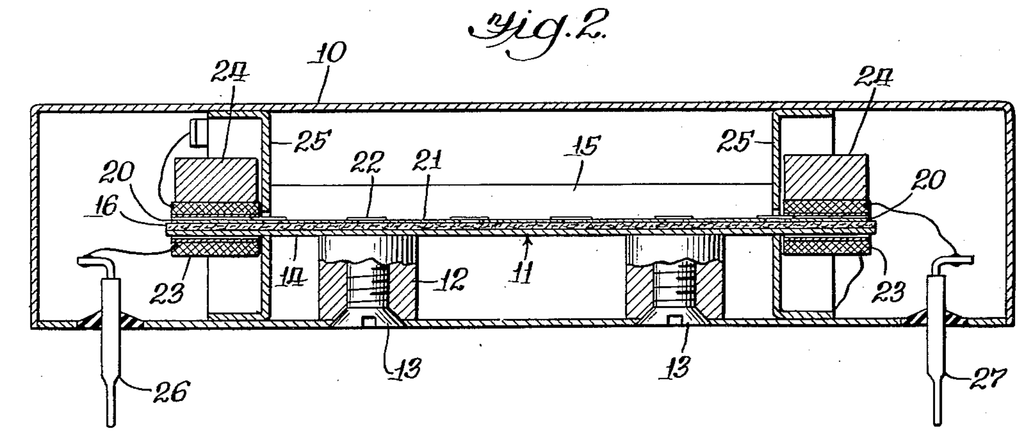
Fig. 2 is a cross sectional view through the filter plates illustrating the coupling, housing, shielding and mounting provisions.

Referring now to the drawings, in Figs. 1 and 2 there is illustrated the housing and mounting structure for the unit. The housing 10 may be formed of any suitable material which can be hermetically sealed. The drawings are greatly enlarged and as previously stated, the over-all dimensions of the housing may be approximately 2½ inches by ½ inch by ¾ of an inch. The filter supporting structure is provided by the trough 11 which is mounted on studs 12 secured to the housing 10 by bolts 13. The trough has a bottom plate 14 and upturned sides 15 within which the filter proper is positioned. Positioned on the bottom of the trough may be a layer of material 16 such as fibre glass or like material on which the filter plates may rest with a minimum of friction.

The filter structure proper includes end plates 20 and intermediate plates 21. In the filter shown two end plates and five intermediate plates are used and these have been found to provide the selectivity characteristics (Fig. 7) required in a highly selective radio receiver. It is pointed out that fewer plates may be used if lesser degree of selectivity is adequate, or that more plates may be used if greater selectivity is required. The various plates are connected together by fine wires 22 which are welded to the edges of the plates and interconnect the adjacent edges of adjacent plates. These wires couple the vibrations from one plate to the next so that the frequency selectivity of each section is added to that of the next to provide an over-all frequency response for the unit.

Positioned about the ends of the filter supporting trough 11 are coils 23 which provide electrical coupling to the filter structure through magnetostrictive action of the end plates 20. Permanent magnets 24 are positioned adjacent the coils 23 to provide a biasing action. Shielding elements in the form of discs 25 are positioned about the trough 11 adjacent the coils 23 to prevent direct electromagnetic and electrostatic coupling between the coils 23 at the two ends of the filter. Such coupling would bypass the selectivity of the filter and thereby destroy the effect of the unit. The coils 23 have one end thereof connected to terminals 26 and 27 which form the input and output to the filter. The other ends of the coils may be connected to the housing so that the input and output may be applied with respect to ground by the use of a single input and a single output connection.

Figure 3:
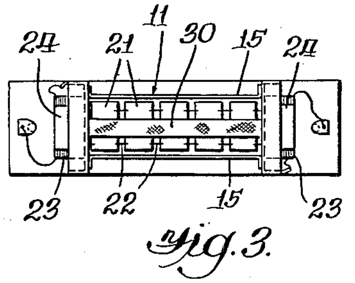
Fig. 3 illustrates the use of damping means on the plates.

Fig. 3 illustrates a filter wherein damping of the plates is provided by the use of a tape 30 having an adhesive coating contacting the top surface of the filter plate. Such a tape serves to damp the filter to prevent vibration thereof in flexural modes and to limit the vibration to transverse vibrations as will be further explained with respect to Fig. 5. The damping action also tends to smooth out irregularities in the response curve and this may be desired to reduce sharp transient responses.

Figure 4:
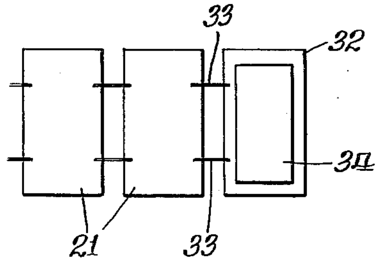
Fig. 4 illustrates the use of a piezo-electric electrical connecting element.

In Fig. 4 there is illustrated a further modification of the filter structure wherein the magnetostrictive end plates are replaced by piezo-electric elements. The construction of the intermediate plates 21 of the filter and the mounting therefor may be exactly the same as in Fig. 1. In place of the magnetostrictive end plates 20, a piezo-electric member such as a quartz crystal plate 32 may be provided. The coupling wires 33 may be connected to the piezo-electric plate 32 by a cold soldering technique. As an example, a thermosetting ethoxylene resin mixed with asbestos fiber powder may be used. The crystal 32 has platings 34 on either side forming electrodes to which an electric potential is applied to provide an electric field instead of the magnetic field used in the magnetostrictive drive. The wire connections to the intermediate plates are made to the piezo-electric plate at points not covered by the electrode platings so that there is no electrical connection between the plating and the coupling wires.

Figure 5:
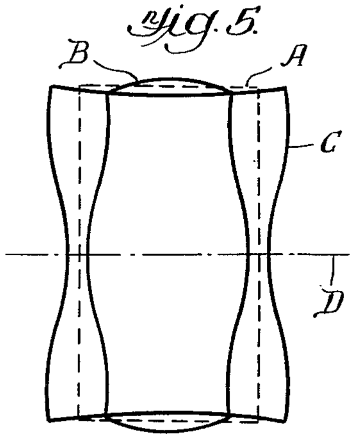
Fig. 5 illustrates the mode of vibration of the plates.

In Fig. 5 there is illustrated the longitudinal mode of vibration of the flat plates which is used in the filter structure. The dotted line designated A shows the normal configuration of the plates, with the solid line B showing the plates in compressed position, and the solid line C showing the plates in expanded position. The illustration in Fig. 5 is exaggerated so that the characteristics are clearly visible. The illustration is for a material having a Poisson's ratio of 0.31 and a height-to-length ratio of 1.82. When the height-to-length ratio is reduced, the double humped vibrating shape of the edge of the plate changes to a simple curve with a peak at the center and then when this ratio becomes very small, the edge shape approaches a straight line. It is therefore apparent that the resonant vibrating shape differs with the height-to-length ratio of the plate.

The center frequency of the filter depends primarily upon the length or transverse dimension of the plates and to a minor extent upon the height or greater dimension. It has been previously established that the band pass of any one filter section depends upon the impedance of the plate and the impedance of the connecting wires. After analysis of the resonant vibrating shape it has been determined that the band pass of a filter section also depends upon the point of connection of the coupling wires to the plates. This provides a third means for controlling the band pass. That is, in addition to the impedance determined by the cross sectional area of the plate, and the impedance determined by the cross sectional area of the coupling wires, the point of connection of the coupling wires to the plate provides a third element which affects the band pass of the filter sections.

Figure 6:
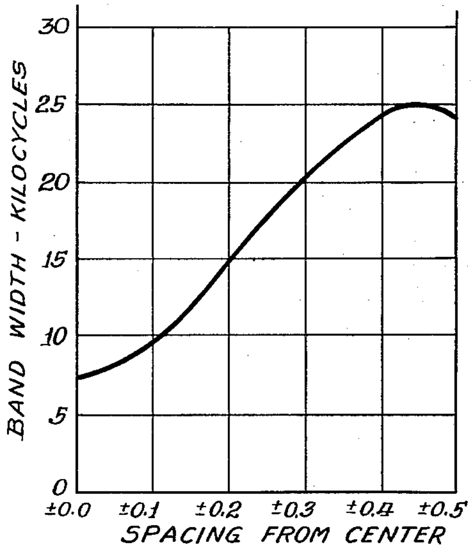
Fig. 6 illustrates the band pass characteristic of the filter with variation of spacing of the coupling wires.

Fig. 6 is a curve illustrating the band pass in kilocycles for a plate operating at 455 kilocycle center frequency when the point of connection of the coupling wires is spaced from the center line D through the plate (Fig. 5) by various distances. The ordinate shows the band width in kilocycles and the abscissa shows the spacing of the point of connection from the center line D as a decimal part of the over-all height of the plate. Accordingly, at the abscissa 0.0 there will be a superimposed pair of wires, or a single coupling wire having a doubled cross section at the center line D of the plates. The abscissa 0.5 represents connection of the wires at the top and bottom edges of the plate, which is at a distance from the center line equal to half the height of the plate. The other points are intermediately spaced between the center and edge of the plate. It is noted that quite a wide range of band widths from about 8 kilocycles to about 25 kilocycles can be provided by variation of the spacing of the coupling wires.

Figure 8:
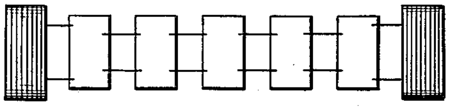
Fig. 8 illustrates schematically an embodiment wherein the characteristic of the end plates is minimized.

In Fig. 8 there is illustrated a filter construction wherein the change in band width resulting from change in coupling wire spacing is used to provide an advantage. In a filter having magnetostrictive coupling end plates, the end plates must be made of a material having good electromagnetostrictive properties and nickel plates have been found to be one of the most satisfactory for such use. Although these plates provide efficient electromechanical energy transfer, the filter characteristics thereof change substantially with changes in temperature. The intermediate plates on the other hand need not have magnetostrictive properties and may be selected purely for their vibration and temperature characteristics. The intermediate plates may be made of a stainless steel which has a high Q and low temperature coefficient and one such material is generally referred to as isoelastic steel. In such a structure the characteristics of the intermediate plates remain substantially constant with changes in temperature but the characteristics of the end plates change to thereby change the over-all filter characteristics. However, by making the band pass of the end plates relatively wide, the characteristics of these plates have relatively small effect on the over-all characteristics of the filter. Although selectivity is sacrificed to some extent, this may be preferred to having the characteristic of the nose of the filter change substantially with temperature. Even by making the band pass of the end plates wide, some selectivity is provided by these plates.

Figure 9:
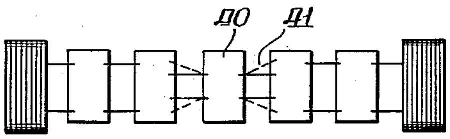
Fig. 9 illustrates a filter structure for providing a particular band pass characteristic.
Figure 10:
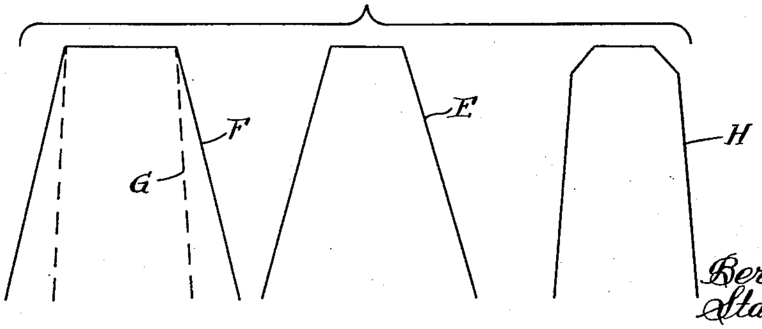
Fig. 10 includes curves illustrating the characteristic of the filter of Fig. 9.

In Fig. 9 there is illustrated a further embodiment wherein changes in the coupling wire spacing may be used to provide a particular desired band pass response. In this structure it will be noted that the wires coupled to the center plate are quite closely spaced to provide a very narrow band pass. The coupling wires to the outer plates are more widely spaced to provide a wider band pass. These responses are illustrated in Fig. 10 wherein the curve E illustrates the band pass of the section including the plate 40, and curve F represents the band pass of the sections which include the outer plates. By providing a plurality of sections having the band pass characteristic F the sides of the characteristic are made steeper as shown by the dotted lines G. When this characteristic is combined with the characteristic E of the center plate 40, the over-all characteristic may be such as shown in curve H.

It will be noted that in the structure of Figure 9 some of the plates have coupling on one side thereof at one spacing and on the other side at another spacing so that the filter sections formed by the two sides of the plate have different band pass characteristics. As an alternate to this the coupling wires may be positioned at an angle as shown by the dotted lines 41 so that only the center plate will have a narrow band pass and the outer plates will all have wider band pass characteristics.

Figure 7:
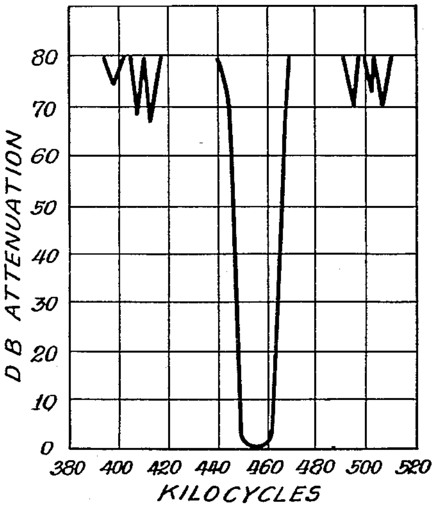
Fig. 7 illustrates the over-all response of a filter structure as illustrated in Figs. 1 and 2.

In Fig. 7 there is shown the over-all characteristic of a filter in accordance with the invention with the filter being constructed to have a center frequency of 455 kilocycles and a band width at a 6 decibel point of 10 kilocycles. At the 80 decibel point the band width is approximately 25 kilocycles with the sides being very steep and although not exactly symmetrical, sufficiently so as to provide desirable operating characteristics. It will be noted that the spurious response are spaced considerably from the operating band and are attenuated by at least 68 decibels.

The filter structure in accordance with the invention has the advantage that the band pass can be adjusted by the position of the coupling wires to compensate for errors in manufacture of the plates and coupling wires. Further, larger and therefore less fragile coupling wires can be used than in prior structures by control of the position of connection thereof to the plates. As stated above, filters having various band pass characteristics can be assembled from the same components by controlling the point of connection of the coupling wires to the plates.

As has been stated, filters having a band pass characteristic with a flat acceptance portion and quite steep rejection slopes have been constructed. This has been accomplished by the use of a relatively small number of plates so that the over-all unit is small, inexpensive to construct, and has relatively low insertion loss. In the event that even sharper selectivity is required additional plates can be used with some increased insertion loss. As has been stated, electromechanical transducer elements of various types can be used such as magnetostrictive plates and piezo-electric crystals.

Although certain embodiments of the invention have been disclosed which are illustrative thereof, it is obvious that various changes and modifications can be made therein within the intended scope of the invention as defined in the appended claims.

We claim:

1. An electromechanical filter including in combination, a plurality of thin plates having substantially parallel edges, connecting means between adjacent plates including a pair of wires connected between an edge of one plate and the adjacent edge of the adjacent plate to interconnect said plates together as a filter, with each plate and the connecting wires secured thereto forming one filter section, said wires being connected to said plates at predetermined points thereon to determine the band pass of said sections, with the band pass of the various sections being selected so that the entire filter has a predetermined band pass characteristic, at least one pair of connecting wires being spaced apart at the connection thereof to one plate by a distance greater than the spacing therebetween at the connection thereof to another plate.

2. An electromechanical filter including in combination, a plurality of thin plates having substantially parallel edges, a pair of wires connected between an edge of one plate and the adjacent edge of the adjacent plate to interconnect said plates together as a filter, with each plate and the connecting wires secured thereto forming one filter section, said wires of at least one pair being relatively widely spaced so that the band pass of the section thereof is relatively wide, and said wires of at least one other pair being relatively closely spaced so that the band pass of the section thereof is relatively narrow, with the band pass of the various sections being combined to make up the band pass characteristic of the entire filter.

3. An electromechanical wave filter including in combination, a plurality of thin plates having substantially parallel edges, a pair of wires connected between an edge of one plate and the adjacent edge of the adjacent plate to interconnect said plates together as a filter, with each plate and the connecting wires secured thereto forming one filter section, said wires being connected to said plates at predetermined points thereon to determine the band pass of said sections, the spacing of the connecting wires of one filter section being different from the spacing of the connecting wires of another filter section so that said sections have different band pass characteristics, with the band pass of the various sections being selected so that the entire filter has the desired characteristics, and electromechanical coupling means connected to the plates at the ends of said filter for applying electrical signals thereto, and for deriving therefrom electrical signals corresponding to the waves selected by the filter.

4. An electromechanical wave filter in accordance with claim 3 wherein said electromechanical coupling means include members made of magnetostrictive material mechanically coupled to the filter plates, and coils about the members for connection to electrical circuits.

5. An electromechanical wave filter in accordance with claim 3 wherein said electromechanical coupling means include piezo-electric members mechanically coupled to said filter plates with electrodes thereon adapted to be connected into electrical circuits.

6. An electromechanical wave filter device including in combination, a filter structure including a plurality of thin plates having substantially parallel edges, a pair of wires connected between an edge of one plate and the adjacent edge of the adjacent plate to interconnect said plates together as a filter, with each plate and the connecting wires secured thereto forming one filter section, said wires being connected to said plates at predetermined points thereon to determine the band pass of said sections, the spacing of the connecting wires of one filter section being different from the spacing of the connecting wires of another filter section so that said sections have different band pass characteristics, with the band pass of the various sections being selected so that the entire filter has the desired characteristics, electromechanical coupling means connected to the plates at the ends of said filter for applying electrical signals thereto and deriving therefrom electrical signals corresponding to the waves selected by the filter, mounting means including a hermetically sealed housing and a trough-like support for said filter structure, and shielding means interposed between said electromechanical coupling means.

7. An electromechanical filter including in combination, a plurality of thin plates having substantially parallel edges, and a pair of wires interconnecting an edge of each plate with the adjacent edge of the adjacent plate so that said plates are interconnected in a ladder like structure, the plates at the ends of said structure being made of a material having characteristics which change substantially with temperature, and the plates intermediate the end plates being made of a material having characteristics substantially unaffected by temperature, said wires interconnecting said intermediate plates being spaced to provide the desired filter band pass characteristics, and said wires interconnecting said end plates to said intermediate plates having wider spacing so that the band pass of said end sections is greater and the over-all band pass characteristics of said filter are substantially unaffected by the characteristics of said end plates.

8. An electromechanical filter including in combination, a plurality of thin plates having substantially parallel edges, and a pair of wires interconnecting an edge of each plate with the adjacent edge of the adjacent plate so that said plates are interconnected in a ladder like structure, at least one of said plates being made of a material having characteristics which change substantially with temperature, other ones of said plates being made of a material having characteristics substantially unaffected by temperature, said wires interconnecting said other plates being spaced to provide the desired filter band pass characteristics, and said wires interconnecting said one plate having wider spacing so that the band pass of the filter section including said one plate is greater, whereby the over-all band pass characteristics of said filter are substantially unaffected by the characteristics of said one plate.

9. An electromechanical filter including in combination, a plurality of thin plates having substantially parallel edges, a plurality of pairs of wires interconnecting the adjacent edges of adjacent plates so that said plates are interconnected in a ladder like structure, said wires of at least one pair having a predetermined spacing to provide a given band pass characteristic to the filter section formed by the wires and the plate connected thereto, and said wires of at least one other pair having a different spacing to provide a different band pass characteristic to the filter section formed by said wires and the plate connected thereto, with the band pass characteristics of all the sections in combination controlling the over-all band pass characteristic of the filter.

10. An electromechanical wave filter device including in combination, a filter structure including a plurality of thin plates having substantially parallel edges, a pair of wires connected between an edge of one plate and the adjacent edge of the adjacent plate to interconnect said plates together as a filter, with each plate and the connecting wires secured thereto forming one filter section, said wires being connected to said plates at predetermined points thereon to determine the band pass of said sections, the spacing of the connecting wires of one filter section being different from the spacing of the connecting wires of another filter section so that said sections have different band pass characteristics, with the band pass of the various sections being selected so that the entire filter has the desired characteristics, electromechanical coupling means connected to the plates at the ends of said filter for applying electrical signals thereto and deriving therefrom electrical signals corresponding to the waves selected by the filter, and mounting means for said filter structure including a trough like support, said support including resilient material directly engaging said filter structure having low friction, and means engaging the top surface of at least one plate of said filter structure for damping the same.

References Cited in the file of this patent

UNITED STATES PATENTS

| | | |
|---|---|---|
| 2,345,491 | Mason | Mar. 28, 1944 |
| 2,617,882 | Roberts | Nov. 11, 1952 |
| 2,652,542 | Anthony et al. | Sept. 15, 1953 |
| 2,652,543 | Anthony et al. | Sept. 15, 1953 |